United States Patent [19]

Piesinger

[11] 4,191,853
[45] Mar. 4, 1980

[54] SAMPLED DATA FILTER WITH TIME SHARED WEIGHTERS FOR USE AS AN LPC AND SYNTHESIZER

[75] Inventor: Gregory H. Piesinger, Scottsdale, Ariz.

[73] Assignee: Motorola Inc., Schaumburg, Ill.

[21] Appl. No.: 950,203

[22] Filed: Oct. 10, 1978

[51] Int. Cl.$^2$ ............................................... G10L 1/00
[52] U.S. Cl. ................................ 179/1 SA; 364/724; 364/825
[58] Field of Search ............... 179/1 SA, 1 SB, 1 SC, 179/1 SD, 1 D; 340/347 AD, 347 DD; 364/724, 825; 333/70 T

[56] References Cited

U.S. PATENT DOCUMENTS

| | | | |
|---|---|---|---|
| 3,597,541 | 8/1971 | Proakis et al. | 364/825 |
| 4,038,495 | 7/1977 | White | 179/1 SA |

OTHER PUBLICATIONS

L. Jackson et al., "An Approach to the Implementation of Digital Filters", IEEE. Trans. on Audio and Elec., Sep. 1968, pp. 413-421.

J. Flanagan, "Spectrum Analysis in Speech Coding", IEEE. Trans. on Audio and Elec., Jun. 1967, pp. 66-69.

Primary Examiner—Malcolm A. Morrison
Assistant Examiner—E. S. Kemeny
Attorney, Agent, or Firm—Eugene A. Parsons

[57] ABSTRACT

Delay devices including CCD delay lines clocked and sampled to simulate a multitap delay line with a weighter, correlator and integrater connected to the delay line by switches which are operated to time share the weighter and correlator with each output of the delay line.

20 Claims, 5 Drawing Figures

SAMPLED DATA FILTER WITH TIME SHARED WEIGHTERS FOR USE AS AN LPC AND SYNTHESIZER

BACKGROUND OF THE INVENTION

Linear prediction coding (LPC) is a digital signal processing technique which makes possible the transmission of digitized voice signals at comparatively low bit rates. Conventional digitized voice (PCM, delta modulation) requires transmission bit rates of 20 kbps and above for good quality. LPC techniques permit good quality performance with transmission bit rates in the range of 1400 to 8000 bits per second. Bandwidth reductions such as this have been accomplished previously by other types of vocoders. Previous vocoders, however, tend to not produce natural sounding speech, and tend to be large and expensive. LPC has been demonstrated to produce good sounding speech. With the present state of LSI technology and LPC vocoders, LPC implementation requires 20 to 50 LSI chips, which is a significant reduction in size, weight, and cost in quantity, but is still a large amount of circuitry. The attractiveness of LPC, compared with other vocoder approaches, is that it is digital in nature, i.e., it is performed by a digital computer of some sort, and the cost of computation has fallen as LSI technology has advanced. However, LPC vocoders, prior to the present invention, are still relatively expensive.

Vocoders are based on the fact that the information content of speech has a bandwidth much less than the bandwidth of the speech signal itself. Vocoders, and LPC in particular, measure certain parameters of the speech signal, and transmit these parameters over a communication channel (at a bandwidth less than that required for the speech signal itself). At the receiver, these parameters are used to reconstruct, or synthesize, a signal which (ideally) sounds like the original speech.

The LPC analyzer (coder) takes the form of a transversal filter with complex weights. The speech signal is passed through a tapped delay line. The output of each tap is weighted and summed together with all of the other weighted tap outputs in a final summer. The weight values are adjusted so as to minimize the error signal at the output of the final summer. The method by which the weight values are determined defines the LPC algorithm. To date, these algorithms have all used digital filtering techniques. Because each tap of the delay line requires a weighter and circuitry for determining the weight values, a great amount of circuitry is required for the analyzer, which greatly increases the expense and complexity. Further, the synthesizer, or decoder, at the other end of the communication network must essentially reverse the procedure and, therefore, requires approximately the same amount of components.

SUMMARY OF THE INVENTION

The present invention pertains to a sampled data filter for use as a linear prediction coder including delay means connected to receive an input signal and provide a series of output signals, weighting means adjustable to substantially null out signals applied thereto and provide output signals indicative of the weighting means adjustment and any error, and time sharing means coupling the weighting means to the delay means for providing a weighting means adjustment and an error signal for each of the series of output signals.

The invention further pertains to a synthesizer for receiving transmitted weighting functions and an error signal and synthesizing an original signal therefrom, including a low pass filter receiving the weighting functions and providing a series of output signals, summing circuitry receiving the error signal, delay means coupled to the summing circuitry and providing a series of output signals and weighting means connected by time sharing apparatus to the delay means and through an integrater to the input of the summing circuitry to provide signals at the output of the summing circuitry which are substantially similar to the original signal.

It is an object of the present invention to provide a new and improved sampled data filter for use as a linear prediction coder.

It is a further object of the present invention to provide a new and improved synthesizer for receiving transmitted weighting functions and an error signal and synthesizing an original signal therefrom.

It is a further object of the present invention to provide a sampled data filter for use as a linear prediction coder wherein a single weighting circuit is time shared at the output of a simulated delay line to substantially reduce the amount of circuitry required.

It is a further object of the present invention to provide improved weighting circuitry utilizing the least mean squared algorithm to provide weighting functions and an error signal in a linear prediction coder.

These and other objects of this invention will become apparent to those skilled in the art upon consideration of the accompanying specification, claims and drawings.

BRIEF DESCRIPTION OF THE DRAWINGS

Referring to the drawings, wherein like characters indicate that parts throughout the Figures.

DESCRIPTION OF THE PREFERRED EMBODIMENTS

Figure 1:
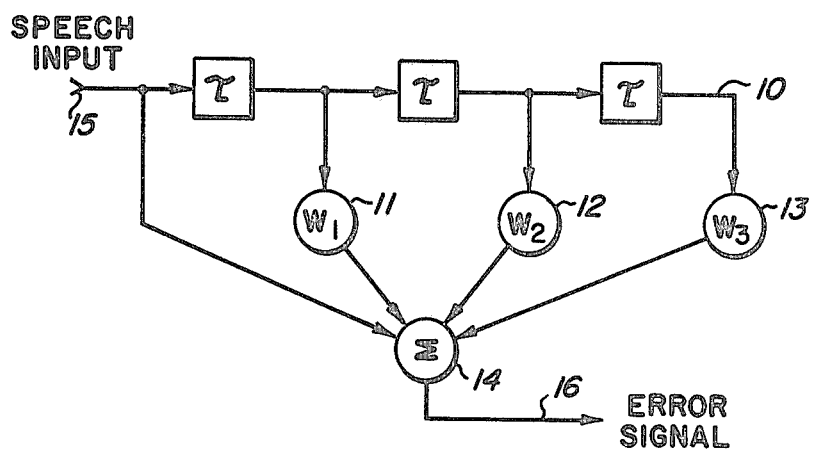
FIG. 1 is a simplified block diagram of a prior art linear prediction coder.

Referring to FIG. 1, a simplified block diagram of a linear predictive coder is illustrated which includes a tapped delay line, generally designated 10, a plurality of complex weights, designated 11–13, and a final summer designated 14. A speech signal is applied to the tapped delay line 10 at an input terminal 15 and each of the complex weights 11–13 receive a signal from a different tap of the delay line 10. The output of each tap is weighted and summed together with all of the other weighted tap outputs in the final summer 14. The weight values are adjusted so as to minimize the error signal at an output terminal 16 of the final summer 14. The method by which the weight values of the weights 11–13 are determined defines the linear prediction coder algorithm. To date, these algorithms have all used digital filtering techniques. The weight values from the weighters 11-13 and the error signal at the terminal 16 are then transmitted to a synthesizer which reconstructs a speech signal from these values. The adjustment of the weights 11-13 to minimize the error signal is extremely complicated and critical.

Figure 2:
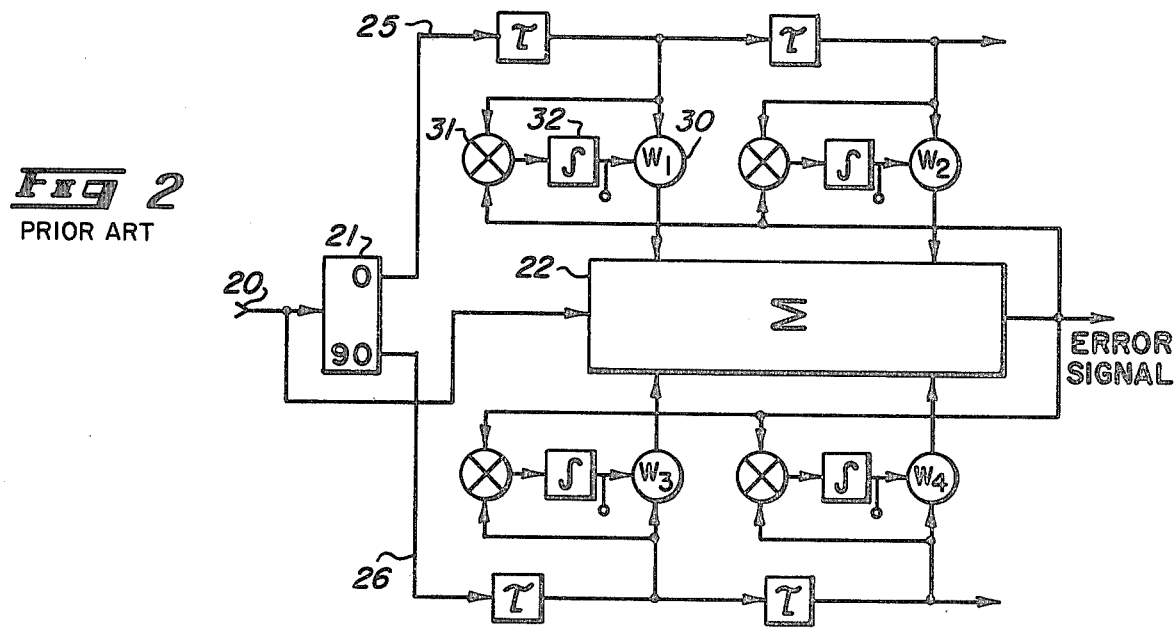
FIG. 2 is a block diagram of a linear prediction coder utilizing a least mean squared algorithm.

Referring to FIG. 2, a block diagram of a linear predictive coder is illustrated which utilizes apparatus incorporating a least mean squared algorithm. In this embodiment a speech signal is applied to an input terminal 20, which is connected to an input of phase shifting means 21 and to a final summing device 22. The phase shifting means 21 may be, for example, a quadrature hybrid 90° phase shifter. The phase shifting means 21 provides a first output to a tapped delay line, generally designated 25, and a second output 90° out of phase with the first output to a second tapped delay line, generally designated 26. Each of the delay lines 25 and 26 are illustrated with only two taps, for illustrative purposes, and it will be understood by those skilled in the art, that many additional taps will be utilized in actual practice. Since the weighting means utilized in conjunction with each of the taps of both delay lines 25 and 26 is identical, only one weighting means will be described in detail.

The first tap of the delay line 25 is connected to the signal input of a weighter 30 and to a first input of a correlator 31. An output of the correlator 31 is connected through an integrater 32 to a control input of the weighter 30. An output of the weighter 30 is connected to one input of the final summer 22 and the output of the final summer 22, in addition to providing the error signal output for the coder, is fed back to a second input of the correlator 31. The weighting circuit 30 may be, for example, a variable amplifier or attenuator wherein the signal from the integrater 32 adjusts the amplitude or weight of the signal passing through the weighting circuit 30 from the delay line 25. The correlator 31 (which may be interpreted to include the integrater 32 in some instances) is a device which compares the error signal at the output of the final summing device 22 to the unweighted signal at the first tap of the delay line 25 and provides a control signal at the output thereof which is indicative of a similarity, or correlating between the two compared signals. This control signal adjusts the weighter 30 until similarities between the error signal and the signal at the first tap of the delay line 25 are eliminated (the error signal is driven towards zero).

The signal present at the first tap of the delay line 25 and at the first tap of the delay line 26 are identical except that they are separated by a 90° phase shift. The weighting means associated with the first tap of the delay line 26 cooperates with the weighting means associated with the first tap of the delay line 25 to eliminate the signal present at the first taps. This signal may be represented by a phasor which is split into two quadrature components by the phase splitting means 21. By adjusting the amplitudes of the two quadrature components, it will be seen by those skilled in the art, that the signal can be completely eliminated. In a similar manner the second taps of the two delay lines 25 and 26 cooperate to provide quadrature signals, etc. In this fashion, the entire speech signal present at the terminal 20 can be defined in terms of a plurality of weighting functions, each of which is available at the output of the integrater 32 and the other integraters in the weighting means not described. The correlator 31 and the correlators of the other weighting means may be, for example, a mixer or multiplier that provides a signal at an output thereof which is representative of the correlation between the signals applied thereto, or it may be any of the complex correlators described in the literature.

Thus, a linear prediction coder is described which accurately converts signals at the various output taps of the delay line into weighting functions that may later be utilized in a synthesizer to reconstruct the original speech signal. A speech signal is composed of an excitation function that either takes the form of a wideband noise that is filtered by the vocal tract or that takes the form of an impulse that rings the filter formed by the vocal tract. The vocal tract filter function changes fairly slowly versus time. If the analyzer time constant is also slow, it will cancel the filter function and the error voltage will consist only of the vocal tract excitation function. By correctly choosing the number of taps, the time delay, and the adaption speed, minimum bandwidth can be achieved that is needed to transmit the weight settings and error signal. A tradeoff exists in how much bandwidth is to be used for sending the weight values versus that used to send the error signal. The faster the adaption speed, the greater the bandwidth necessary to transmit the weight functions and the lesser the bandwidth of the error signal and vice versa.

Figure 3:
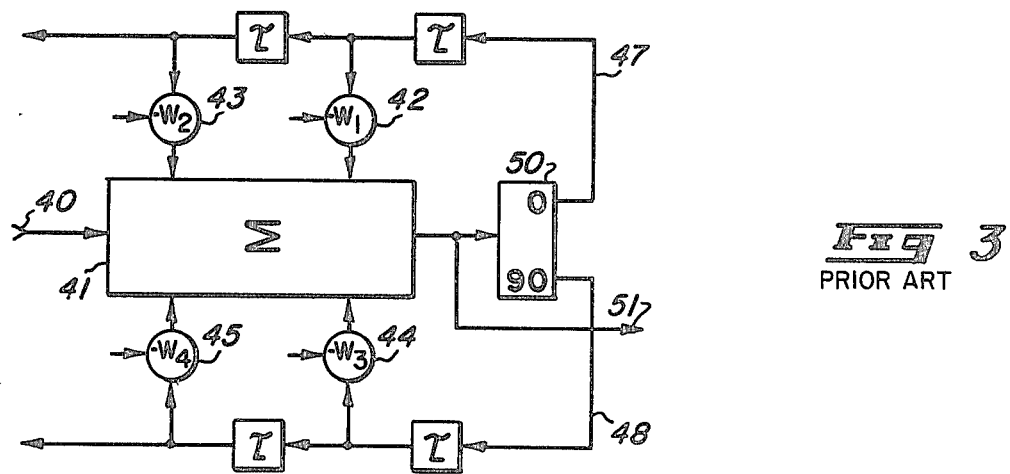
FIG. 3 is a simplified block diagram of a synthesizer for use with the coder of FIG. 2.

Referring to FIG. 3, a synthesizer is illustrated, which is compatible with the coder of FIG. 2. The synthesizer is illustrated in simplified block form since it is for illustrative purposes only. The synthesizer transfer function must be the inverse of the analyzer transfer function, since it must reproduce the original speech signal from the weighting functions and the error signal. In the simplified version of FIG. 3, the error signal is applied to an input terminal 40 connected to an input of a summing device 41. The weighting functions are applied to control inputs of weighters 42-45. The weighters 42-45 are similar to the weighter 30 in FIG. 2 with the first weighter 42 being connected to the first tap of a delay line, generally designated 47, the second weighter 43 being connected to the second tap of the delay line 47, the third weighter 44 being connected to the first tap of a second delay line, generally designated 48, and the fourth weighter 45 being connected to a second tap of the delay line 48. The outputs of the weighters 42-45 are connected to inputs of the summing device 41. The output of the summing device 41 is connected through phase shifting means 50, similar to the phase shifting means 21 in FIG. 2, to the inputs of the delay lines 47 and 48 respectively. The output of the summing means 41 also provides the synthesized speech signal at an output terminal 51. It will be understood by those skilled in the art that the number of taps and weighters utilized in the apparatus of FIG. 3 will correspond with the number of taps and weighting means utilized in the analyzer or coder of FIG. 2.

The analyzer embodiment illustrated in FIG. 2 requires, for example, 20 sets of correlators, integraters and weighters for a 10 tap delay line. Further, the synthesizer of FIG. 3 requires 20 weighters for the same 10 tap delay line. These embodiments do not offer much hardware savings over the standard digital approach and, consequently, the analyzer embodiment of FIG. 4 and the synthesizer embodiment of FIG. 5 were developed.

Figure 4:
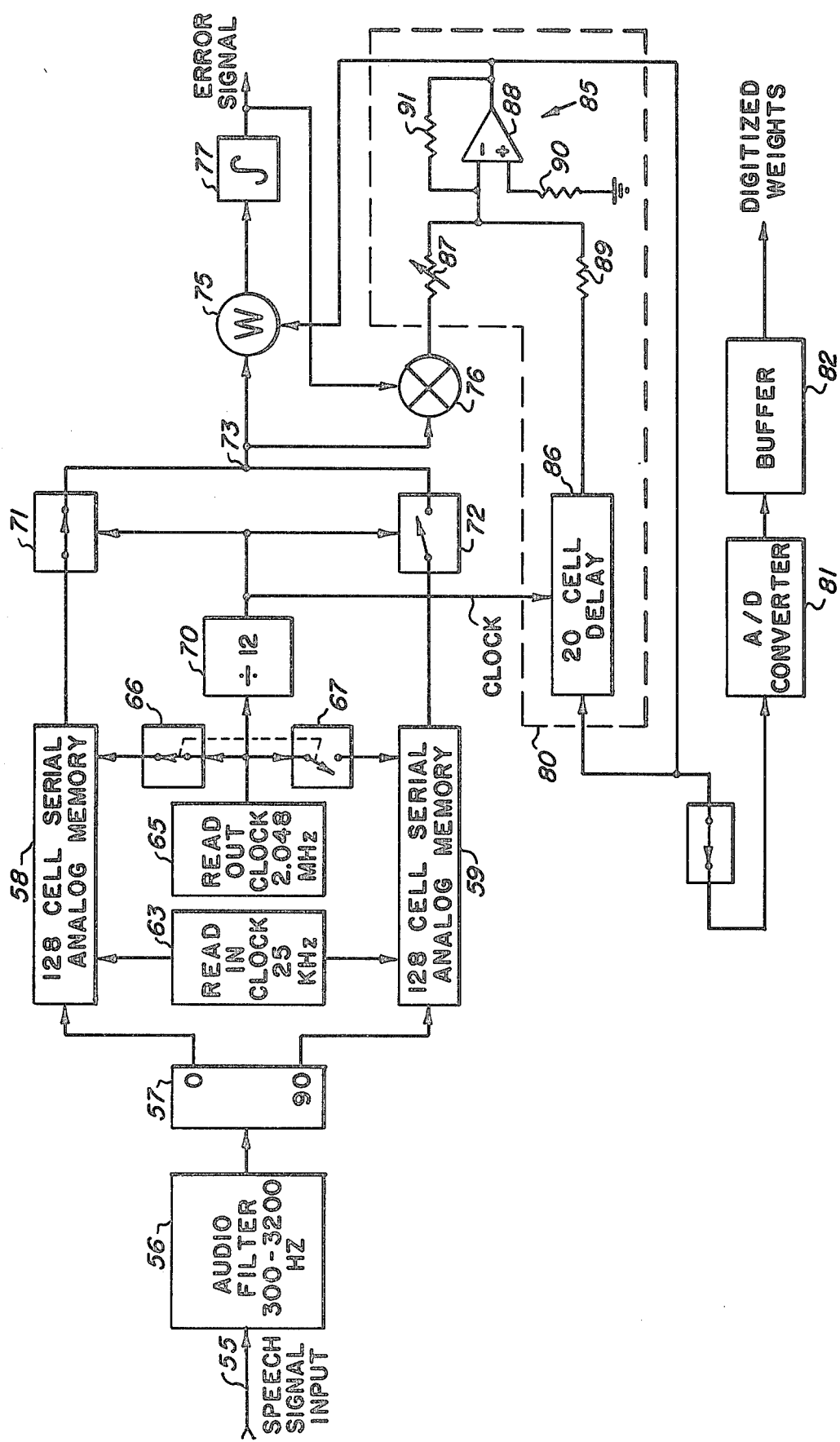
FIG. 4 is a block diagram of a linear prediction coder utilizing the least mean squared algorithm and time sharing complex weights in accordance with the present invention.

Referring specifically to FIG. 4, an input terminal 55, adapted to have a speech or audio signal applied thereto, is connected through an audio filter 56 to an input of phase shifting means 57. The phase shifting means may be a quadrature hybrid, as described in conjunction with FIG. 2, and provides a pair of outputs in quadrature to first and second serial analog memory devices 58 and 59, respectively. The memory devices 58 and 59 may be, for example, charge coupled devices containing buffered memory cells with independent read in and read out circuits. In the particular memories illustrated, data can be read in at one rate and later read out as many times as desired at another rate. A 128 cell unit is commercially available in a 16 pin DIP that only consumes 4 milliwatts of power. In the specific embodiment illustrated a clock 63 is connected to the memories 58 and 59 for clocking information into the memories and the specific rate in this example is 25 kilohertz. A clock 65, for reading the information out of the memories 58 and 59 is connected through a pair of alternate switches (shown schematicaly) 66 and 67 to the read out terminals of the memories 58 and 59, respectively. In this embodiment, the read out clock 65 has a frequency of 2.048 megahertz so that, after each audio sample is read in, all of the cells are read out before another audio sample is read in. The clock 65 is also connected through a programmable divider 70 to a pair of alternate switches 71 and 72, which are connected to alternately provide output signals from the memories 58 and 59, respectively, to a common terminal 73. The programmable divider 70 is constructed to divide by 12, in this embodiment, and reset every 120 counts. Thus, the programmable divider 70 divides the frequency from the clock 65 so as to select an audio sample every 12th cell from each of the memories 58 and 59. Since 128 cell serial analog memories are used for memories 58 and 59, this makes the serial analog memory devices 58 and 59 look like a 10 tap delay line with a tap every 480 microseconds. The last delay of 320 microseconds is discarded by the resetting of the programmable divider 70. It will be understood by those skilled in the art, that the memories, clock frequencies and programmable divider are utilized as an example and that other read in rates, read out rates and divider ratios may be utilized to simulate any number of taps and delay lengths within the capabilities of the devices utilized. In the particular memories 58 and 59 described, a maximum retention time of 40 microseconds is possible so that a fine structure down to 25 hertz can be realized if desired. The switches 66, 67, 71 and 72 are FET analog switches but other switches might be utilized by those skilled in the art, if desired. Thus, the memories 58 and 59 and the clocks 63 and 65 with the switches 66 and 67 provide a delay means and the programmable divider 70 with the switches 71 and 72 provide time sharing means for supplying signals to the terminal 73 that appear to eminate from two delay lines with signals applied thereto in quadrature.

The output terminal 73 of the time sharing means is connected to a signal input of a weighter 75 and to a first input of a correlator 76. The output of the weighter 75 is connected through an integrater 77 to a terminal 78 which provides an error signal output for the analyzer and which is connected to a second input of the correlator 76. The output of the correlator 76 is connected to an input of an integrator, generally designated 80. The output of the integrator 80 is connected to the control terminal of the weighter 75 and to an input of an analog to digital converter 81. Because of the high speed read out of the memories 58 and 59 in the delay means, the information applied to the converter 81 is supplied in bursts and, therefore, the output of the converter 81 is bursts of digital information. These bursts of digital information are applied to a buffer 82 which slows the information to the normal rate so that the output thereof is a constant series of data representative of the weighting functions.

The integrator 77 performs the functions of a final summing circuit so that the error signal is available at the output terminal 78. To form the integration function between the correlator 76 and the weighter 75, without using a separate integrater for each tap output, a summing amplifier, generally designated 85 and a charge coupled device delay line 86 is used. The summing amplifier 85 has a first input (connected to the output of the correlator 76) connected through a variable resistor 87 to the inverting input of an operational amplifier 88. The output of the delay line 86 forms the second input and is connected through a resistor 89 to the inverting input of the operational amplifier 88. The non-inverting input of the operational amplifier 88 is connected through a resistor 90 to ground. The output of the operational amplifier 88 is the output of the integrator 80 and is connected to the input of the delay line 86 as well as through a resistor 91 to the inverting input thereof. Generally, it has been found that the resistors 89 and 91 should be approximately equal and the resistor 87 should be much smaller than the resistor 89. Also, since the memories 58 and 59 each provide 10 outputs to the terminal 73, the delay line 86 should be a 20 cell charge coupled device. Each tap output at the terminal 73 is correlated in turn with the error signal to form a correlation voltage. Each particular correlation voltage is attenuated and added to the total sum, formed by adding all previous correlation voltages for that particular tap output, which forms the particular weight value and the new total sum. The delay line 86 forms a temporary storage for the new total sum until its turn comes up again. The integration time constant is selected by controlling how much correlation voltage is added to the total sum. The values of the weight functions change at a rate equal to the bandwidth of the integrator loop 80. At twice this rate, the values are digitized by the converter 81 and loaded into the buffer 82. Data is loaded at a burst rate equal to the rate at which the weights are clocked through the delay line 86. The digitized weights are then transmitted at a constant rate. The error signal at the terminal 78 can be either sent directly, digitized or encoded as well known by those skilled in the art.

Figure 5:
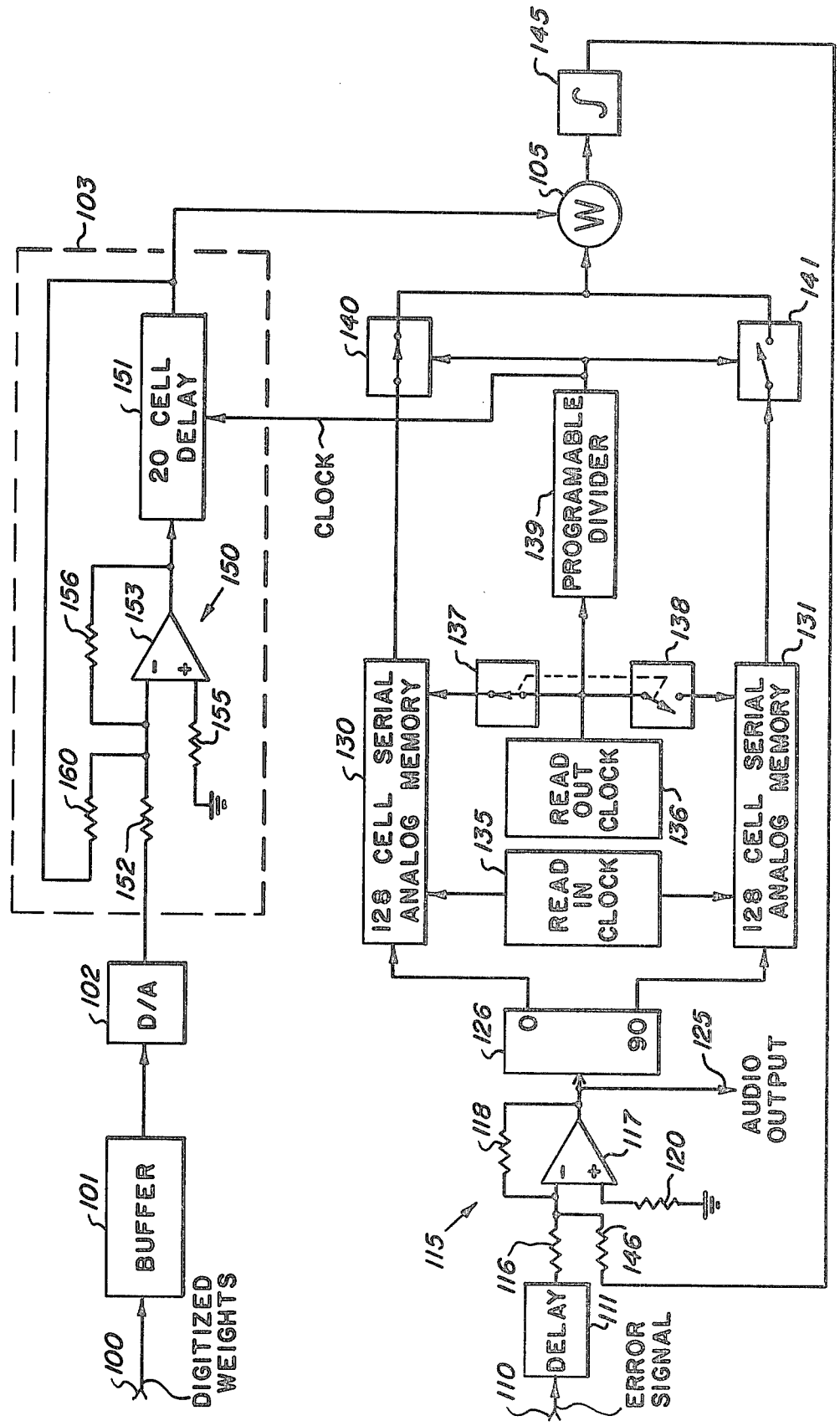
FIG. 5 is a block diagram of a synthesizer for use in conjunction with the coder of FIG. 4.

Referring to FIG. 5, a synthesizer compatible with the analyzer of FIG. 4 is illustrated. Communications apparatus for transmitting the weight functions and error signal are not shown, since they do not form a part of this invention. The digitized weights, or constant digital data indicative of the weight functions, is applied to an input terminal 100 which is connected to an input of a buffer 101. The buffer 101 operates generally the opposite of the buffer 82 in FIG. 4 in that it converts the constant data back into bursts of data similar to those produced by the analyzer aparatus of FIG. 4. The bursts of data are applied to a digital-to-analog converter 102 and the output thereof is applied to a low pass filter generally designated 103. The output of the low pass filter 103 is connected to the control input of a weighter 105. The transmitted error signal is applied to an input terminal 110 connected to the input of a delay 111 which is utilized to bring the error signal into time conformity with the bursts of analog data at the output of the converter 102. The delayed error signal is applied to one input of a summing circuit, generally designated 115. The one input of the summing circuit 115 is connected through a resistor 116 to the inverting input of an operational amplifier 117. The inverting input is also connected through a feedback resistor 118 to the output of the operational amplifier 117. The non-inverting input of the operational amplifier 117 is connected through a resistor 120 to ground. The output of the operational amplifier 117 is connected to an output terminal 125 which has available thereon the synthesized audio signal. The output is also connected to the input of phase shifting means 126, which is similar to the phase shifting means 57 of the analyzer in FIG. 4. A first or inphase output of the phase shifting means 126 is connected to the input of a serial analog memory 130 and the quadrature output of the phase shifting means 126 is connected to the input of a second serial analog memory 131. A clock 135 is connected to the memories 130 and 131 for clocking information therein. A second clock 136 is connected through a pair of alternating switches 137 and 138 to the read out terminals of the memories 130 and 131. The clock 136 is also connected to a programmable divider 139, which in turn operates a pair of alternating switches 140 and 141. The switches 140 and 141 alternately connect the outputs of the memories 130 and 131, respectively, to the signal input of the weighter 105. The output of the weighter 105 is connectd through an integrater 145 to a second input of the summing circuit 115, which is a resistor 146 connected to the inverting input of the operational amplifier 117.

The low pass filter 103 includes a summing circuit 150 and a charge coupled device delay line 151. The input to the low pass filter from the converter 102 is connected through a resistor 152 to the inverting input of an operational amplifier 153. The non-inverting input of the amplifier 153 is connected through a resistor 155 to ground. The inverting input is also connected through a feedback resistor 156 to the output of the operational amplifier 153, which is also connected to the input of the delay line 151. The output of the delay line 151 forms the output for the low pass filter 103 and is connected to the weighter 105 is well as through a resistor 160 to the inverting input of the operational amplifier 153. The low pass filter 103 performs a low pass filtering function for each weight value, without using a separate filter for each tap weight. Again, as in the description of the delay line in the apparatus of FIG. 4, the previous output value is stored in the delay line 151 and added to a small part of the next input. Many feedback iterations are performed for each input value so that the output slowly converges to the input value which gives the low pass smoothing function. The low pass filter 103 structure is similar to the one used for the integrater 80 in the analyzer of FIG. 4 except that the feedback resistor ratio from the delay line 151 is less than 1. That is, the resistor 160 has a value less than the resistor 156 and the resistor 152 has a value much less than the resistor 156. This allows the output voltage of the filter 103 to converge on a zero input voltage whereas the output voltage of the integrater 80 will remain constant. The memories 130 and 131, the clocks 135 and 136, the programmable divider 139 and switches 137, 138, 140 and 141 operate essentially as the similar components in the analyzer of FIG. 4 and at rates which are compatible with an associated analyzer, as will be apparent to those skilled in the art. Thus, the weighter 105 is time shared and the entire circuit essentially reverses the process performed by the apparatus in FIG. 4 so that the audio at the output terminal 125 is a very close reproduction of the audio originally applied to the terminal 55 in FIG. 4.

Thus, an anaylzer and cooperating synthesizer have been shown which utilize the least mean squared algorithm to improve upon the operation of the standard digital filters utilized for linear prediction coder circuits. Further, an embodiment of the present invention is disclosed wherein charge coupled devices and electronic switches are utilized to simulate a multi-tapped delay line and the outputs thereof are time shared with a single weighting structure so that the savings of hardware is substantial. While I have shown and described specific embodiment of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

What is claimed is:
1. A speech analyzer comprising:
    (a) delay means connected to receive an input signal and provide a series of output signals simulating a multitap delay line;
    (b) weighting means adjustable to substantially null out signals applied thereto and provide output signals indicative of the weighting means adjustment and any error; and
    (c) time sharing means coupling the weighting means to the delay means for providing a weighting means adjustment and an error signal for each of the series of output signals.
2. A synthesizer for receiving transmitted weighting functions and an error signal and synthesizing an original signal therefrom, said synthesizer comprising:
    (a) a low pass filter coupled to receive the weighting functions and to provide a series of output signals, one for each weighting function;
    (b) summing circuitry having a first input connected to receive the error signal, a second input and an output;
    (c) delay means coupled to the output of said summing circuitry and providing a series of output signals simulating a multitap delay line;
    (d) weighting means having a signal input, a control input connected to receive the series of output signals from said low pass filter and an output connected through integrating means to the second input of said summing circuitry; and
    (e) time sharing means coupling the series of output signals from said delay means to the signal input of said weighting means, said weighting means being adjusted for each of the output signals in the series in accordance with corresponding output signals in the series from the low pass filter to provide signals at the output which, when integrated and combined in the summing circuitry, are substantially similar to the original signal.
3. A synthesizer as claimed in claim 2 wherein the low pass filter includes a summing amplifier, having a first input connected to receive the weighting function, a second input and an output, and a charge coupled device delay line connected between the output and the second input of said summing amplifier and having a number of cells equal to the number of weighting functions in a series.

4. A synethsizer as claimed in claim 2 wherein the delay means includes phase shift means for dividing the output of the summing circuit into two components out-of-phase with each other, a first delay circuit connected to receive one of the two components from said phase shift means and delay the component at an output thereof by a plurality of predetermined amounts of time, and a second delay circuit connected to receive the other of the two components from said phase shift means and delay the component at an output thereof by a plurality of predetermined amounts of time.

5. A synthesizer as claimed in claim 4 wherein the first and second delay circuits each include a charge coupled device.

6. A synthesizer as claimed in claim 5 including in addition clock means connected to the first and second delay circuits for reading-out information at a substantially higher rate than the information is read-in.

7. A synthesizer as claimed in claim 6 wherein the time sharing means includes a preprogrammed divider and two switches for alternately selecting samples from the first and second charge coupled devices and resetting the divider after a sample has been selected from each of the charge coupled devices for each of the weighting functions.

8. A linear prediction coder utilizing the least mean squared algorithm to provide a plurality of weighting functions and an error signal in response to an input signal, said coder comprising:
  (a) delay means connected to receive the input signal and provide a series of output signals having different predetermined amounts of time delay;
  (b) weighting means including
    (1) a weighter having a signal input, a control input and an output,
    (2) a correlator having a first input connected to the signal input of said weighter, a second input and an output,
    (3) an integrater having an input connected to the output of said correlator and an output connected to the control input of said weighter, the output of said integrater also providing an output of the coder indicative of the weighting functions, and
    (4) final summing means having an input connected to the output of said weighter and an output connected to the second input of said correlator, the output of said final summing means also providing an output signal of the coder indicative of the error in the weighting functions; and
  (c) time sharing means coupling the output of said delay means to the signal input of said weighter and the first input of said correlator.

9. A linear prediction coder as claimed in claim 8 wherein the integrator includes a summing circuit, having a first input forming the input of the integrater, a second input and an output, and a charge coupled device delay line having a number of cells equal to the number of output signals in the series from the delay means, said delay line having an input connected to the output of said summing circuit and an output connected to the second input of said summing circuit.

10. An analog linear prediction coder utilizing the least mean squared algorithm to provide a plurality of weighting functions and an error signal in response to an input signal; said coder comprising:
  (a) phase shift means for dividing the input signal into two components out-of-phase with each other;
  (b) first delay means connected to receive one of the two components from said phase shift means and delay the component at an output thereof by a plurality of predetermined amounts of time;
  (c) second delay means connected to receive the other of the two components from said phase shift means and delay the component at an output thereof by a plurality of predetermined amounts of time;
  (d) switching means connected to the outputs of the first and second delay means for periodically providing at an output of said switching means a sample of the signal available at the output of one of said first and second delay means at the time of switching;
  (e) a correlator having a first input connected to the output of said switching means, a second input and an output;
  (f) a weighter having a signal input connected to the output of said switching means, a control input and an output;
  (g) an integrator having an input conncted to the output of said correlator and an output connected to the control input of said weighter, the output of said integrator also providing a weight signal for application to output means of the coder; and
  (h) a final summing circuit having an input connected to the output of said weighter and an output connected to the second input of said correlator, the output of said first summing circuit also providing an error signal for application to output means of the coder.

11. An analog linear prediction coder as claimed in claim 10 wherein the phase shift means includes a quadrature hybrid 90° phase shifter.

12. An analog linear prediction coder as claimed in claim 10 wherein the first and second delay means each include a serial analog memory designed for having information read-in and read-out at different rates.

13. An analog linear prediction coder as claimed in claim 12 wherein the first and second delay means each include a charge coupled device.

14. An analog linear prediction coder as claimed in claim 13 wherein the switching means includes FET semiconductors designed for alternately connecting the output of one of the charge coupled devices to the inputs of the weighter and correlator.

15. An analog linear prediction coder as claimed in claim 13 including in addition clock means connected to the first and second delay means for reading-out information at a substantially higher rate than the information is read-in.

16. An analog linear prediction coder as claimed in claim 10 wherein the final summing circuit includes an integrater.

17. An analog linear prediction coder as claimed in claim 10 wherein the integrater includes a summing circuit having first and second inputs and an output and a delay line, the first input of the summing circuit is connected to the output of the correlator, the second input of the summing circuit is connected to the output of the delay line and the output of the summing circuit is connected to the input of the delay line and provides the output for the integrater.

18. An analog linear prediction coder as claimed in claim 17 wherein the delay line includes a charge coupled device.

19. An analog linear prediction coder as claimed in claim 10 wherein the output means associated with the integrater includes means for converting the weight signal to a constant digital signal.

20. An analog linear prediction coder as claimed in claim 10 including in addition a decoder in communication therewith for receiving the weight signal and the error signal, said decoder including
(1) a low pass filter having an input, connected to receive the weight signals, and an output;
(2) a summing circuit having a first input connected to receive the error signal, a second input and an output, the output of said decoder summing circuit providing the decoder output signal;
(3) phase shift means connected to the output of said decoder summing circuit for dividing signals at the output into two components out-of-phase with each other;
(4) first delay means connected to receive on of the two components from said decoder phase shift means and delay the component at an output thereof by a plurality of predetermined amounts of time;
(5) second delay means connected to receive the other of the two components from said decoder phase shift means and delay the component at an output thereof by a plurality of predetermined amounts of time;
(6) switching means connected to the outputs of the decoder first and second delay means for periodically providing at an output of said decoder switching means a sample of the signal available at the output of one of said decoder first and second delay means at the time of switching;
(7) a weighter having a signal input connected to the output of said decoder switching means, a control input connected to the output of said decoder low pass filter and an output; and
(8) an integrater coupling the output of said decoder weighter to the second input of said decoder summing circuit.

* * * * *